(12) United States Patent
Banks

(10) Patent No.: US 7,096,409 B2
(45) Date of Patent: Aug. 22, 2006

(54) REED-SOLOMON DECODER AND DECODING METHOD FOR ERRORS AND ERASURES DECODING

(75) Inventor: David Murray Banks, Bristol (GB)

(73) Assignee: Hewlett-Packard Development Company, L.P., Houston, TX (US)

( * ) Notice: Subject to any disclaimer, the term of this patent is extended or adjusted under 35 U.S.C. 154(b) by 272 days.

(21) Appl. No.: 10/632,125

(22) Filed: Jul. 30, 2003

(65) Prior Publication Data

US 2005/0278610 A1    Dec. 15, 2005

(30) Foreign Application Priority Data

Jul. 31, 2002    (GB) ................. 0217847.3

(51) Int. Cl.
*H03M 13/15*    (2006.01)
(52) U.S. Cl. .................................................. 714/784
(58) Field of Classification Search ................. 714/784
See application file for complete search history.

(56) References Cited

U.S. PATENT DOCUMENTS

| 4,868,828 | A |   | 9/1989  | Shao et al. ............... 371/5.1 |
|-----------|---|---|---------|-----------------------------------|
| 5,099,482 | A |   | 3/1992  | Cameron .................. 371/37.1 |
| 5,130,990 | A |   | 7/1992  | Hsu et al. ................ 371/37.1 |
| 5,170,399 | A |   | 12/1992 | Cameron et al. ........ 371/37.1 |
| 5,323,402 | A |   | 6/1994  | Vaccaro et al. .......... 371/37.1 |
| 5,373,511 | A |   | 12/1994 | Veksler .................... 371/37.4 |
| 5,377,207 | A |   | 12/1994 | Perlman .................. 371/37.1 |
| 5,517,509 | A | * | 5/1996  | Yoneda .................... 714/785 |
| 5,535,225 | A | * | 7/1996  | Mayhew et al. .......... 714/785 |
| 5,566,190 | A | * | 10/1996 | Hattori .................... 714/785 |
| 5,642,367 | A |   | 6/1997  | Kao ........................ 371/40.1 |
| 5,715,262 | A |   | 2/1998  | Gupta ...................... 371/37.1 |
| 5,742,620 | A | * | 4/1998  | Iwamura .................. 714/784 |
| 5,771,244 | A |   | 6/1998  | Reed et al. ............... 371/37.01 |
| 5,996,103 | A |   | 11/1999 | Jahanghir ................. 714/755 |
| 6,131,178 | A |   | 10/2000 | Fujita et al. ............. 714/784 |
| 6,256,763 | B1 | * | 7/2001  | Oh et al. .................. 714/784 |
| 6,304,994 | B1 | * | 10/2001 | Oh et al. .................. 714/784 |
| 6,347,389 | B1 |   | 2/2002  | Boyer ...................... 714/784 |
| 6,449,746 | B1 | * | 9/2002  | Truong et al. ............ 714/784 |
| 6,639,865 | B1 | * | 10/2003 | Kwon ...................... 365/230.03 |
| 6,704,902 | B1 | * | 3/2004  | Shinbashi et al. ........ 714/785 |

FOREIGN PATENT DOCUMENTS

| EP | 0 133 137 A1 | 8/1985  |
|----|--------------|---------|
| EP | 0 296 828 A2 | 12/1988 |
| EP | 0 620 654 A2 | 10/1994 |
| EP | 0 918 334 A2 | 5/1999  |

(Continued)

OTHER PUBLICATIONS

U.S. Appl. No. 10/632,123, filed Jul. 30, 2003, Banks et al.

(Continued)

*Primary Examiner*—Stephen M. Baker

(57) ABSTRACT

A single polynomial expander 22 is time multiplexed to produce firstly a modified syndrome polynomial $T(x)$ and then an erasure located polynomial $\Lambda(x)$. $T(x)$ is supplied to a key equation solving unit 32 which solves the key equation to calculate an error locator polynomial $\sigma(x)$ and an errata evaluator polynomial $\omega(x)$. These polynomials $\sigma(x)$, $\Lambda(x)$ and $\omega(x)$ form three inputs to polynomial evaluators 52–56 and a Forney block 62 for determining the location and magnitude of each symbol error and symbol erasure, allowing the received codeword to be corrected in a correction block 72. Optionally, a transform block 42 is provided to avoid unnecessary delay and improve throughput when decoding shortened codewords.

14 Claims, 7 Drawing Sheets

FOREIGN PATENT DOCUMENTS

WO 97/00559 1/1997

OTHER PUBLICATIONS

U.S. Appl. No. 10/632,130, filed Jul. 30, 2003, Banks et al.

Berlekamp, E., et al., "A Hypersystolic Reed-Solomon Decoder," *Reed-Solomon Codes and Their Applications*, IEEE Press, New York, pp. 205-241 (1994).

Berlekamp, E., "Bit-Serial Reed-Solomon Encoders," *IEEE Transactions on Information Theory*, vol. IT-28, No. 6, pp. 869-874 (Nov. 1982).

Berlekamp, E., "Bounded Distance + 1 Soft-Decision Reed-Solomon Decoding," *IEEE Transactions on Information Theory*, vol. 42, No. 3, pp. 704-720 (May 1996).

* cited by examiner

REED-SOLOMON DECODER AND DECODING METHOD FOR ERRORS AND ERASURES DECODING

The present invention relates in general to a Reed-Solomon decoder, and to a method for decoding Reed-Solomon encoded data. In particular, the invention relates to a decoder and a decoding method that are able to decode efficiently in the presence of errors and erasures.

Reed-Solomon error correcting codes are applicable to a wide variety of environments. The most noteable examples are data storage, such as on optical disc media or solid state media, and long-distance data transmissions such as from deep space to earth.

RS encoded data comprises codewords each having a predetermined number of symbols. When RS encoded data is stored or transmitted, the value of one or more symbols in a codeword may become corrupt, i.e. become changed to an incorrect value or become unknown. This is termed a symbol error. In some environments, the location of a corrupt symbol can be predicted and declared in advance of decoding (e.g. because data could not be read from a storage media, or part of a data transmission was not received). This is termed a symbol erasure. The term errata refers generally to either errors or erasures.

Most RS decoders handle only errors. However, some known RS decoders are designed to perform decoding handling both errors and erasures. Here, the decoder receives erasure information, which indicates the location of zero or more suspected corrupt symbols within a codeword. Conveniently, a one bit erasure indicator is applied to each symbol, to indicate whether that symbol has been declared as an erasure. An RS (B,B−2T) code forms codewords of length B and is mathematically guaranteed to correct up to T symbol errors, and up to 2T symbols erasures, or any pattern of E symbol errors and J symbol erasures, provided that $2E+J \leq 2T$. To correct an error, the decoder must find both its location and its magnitude, whereas to correct an erasure, only the magnitude of the correction must be found. Hence, erasure information allows more corrupt symbols to be corrected, compared with the situation where the erasure information is not available.

A problem arises in that an errors and erasures decoder is more complex and is physically larger that an errors-only decoder. Hence, an errors and erasure decoder suffers a disadvantage in terms of both manufacturing cost and operating costs. As a result, designers tend to employ the less powerful but simpler and cheaper errors-only decoders, and forego the considerable decoding advantages available through using an errors and erasures decoder.

An aim of the present invention is to provide a Reed-Solomon decoder and decoding method for errors and erasures, which can be implemented efficiently. In particular, a preferred aim is to minimise complexity of the decoder and, when realised as hardware, to minimise the size of the decoder. Other aims and advantages will become clear from the following description, and from practice of the invention.

According to a first aspect of the present invention there is provided a method for decoding of Reed-Solomon encoded data, comprising the steps of: receiving a codeword comprising a set of symbols, and calculating a syndrome polynomial $S(x)$ for the received codeword; receiving erasure information which identifies zero or more symbols in the received codeword that have been declared as a symbol erasure; calculating a modified syndrome polynomial $T(x)$ from the syndrome polynomial $S(x)$ and then calculating an erasure locator polynomial $\Lambda(x)$, each with reference to the received erasure information; finding an error locator polynomial $\sigma(x)$ and an errata evaluator polynomial $\omega(x)$, from the modified syndrome polynomial $T(x)$; determining a location and magnitude of symbol errors and symbol erasures in the received codeword, from the error locator polynomial $\sigma(x)$, the erasure locator polynomial $\Lambda(x)$, and the errata evaluator polynomial $\omega(x)$; and correcting the received codeword using the determined location and magnitude of symbol errors and symbol erasures.

In this method, preferably the modified syndrome polynomial $T(x)$ and the erasure locator polynomial $\Lambda(x)$ are calculated separately. Preferably, the method comprises receiving the erasure information identifying zero or more of the symbols J as erasures, and calculating a set of terms $\alpha^{-v_i}$ where the set of $\alpha^{-v_i}$ represents locations of the J erasures; and calculating each of a modified syndrome polynomial $T(x)$ and an erasure locator polynomial $\Lambda(x)$ using the equation:

$$\text{polyout}(x) = \text{polyin}(x) \cdot (x + \alpha^{-v_0})(x + \alpha^{-v_1})(x + \alpha^{-v_2}) \ldots (x + \alpha^{-v_{j-1}})$$

by setting polyin(x) to $S(x)$ to calculate $T(x)$, and setting polyin(x) to 1 to calculate $\Lambda(x)$.

Preferably, the method comprises calculating the modified syndrome polynomial $T(x)$ in a first time multiplexed mode, and then generating the erasure locator polynomial $\Lambda(x)$ in a second time multiplexed mode. Ideally, the erasure locator polynomial $\Lambda(x)$ is calculated in parallel with the step of finding the error locator polynomial $\sigma(x)$ and the errata evaluator polynomial $\omega(x)$. Preferably, the calculating step comprises calculating each of $T(x)$ and $\Lambda(x)$ using a single polynomial expander.

Preferably, the step of finding the error locator polynomial $\sigma(x)$ and the errata evaluator polynomial $\omega(x)$ from the modified syndrome polynomial $T(x)$ comprises solving the key equation:

$$\sigma(x) \cdot T(x) = \omega(x) \bmod x^{2T}.$$

Preferably, the key equation is solved by Euclid's algorithm, or an equivalent function.

Preferably, the method comprises finding a location of zero or more symbol errors E by evaluating the error locator polynomial $\sigma(x)$ such that if $\sigma(x)=0$ for some $x=\alpha^{-i}$ then an error has occurred in symbol i, and evaluating a derivative $\sigma'(x)$ of the error locator polynomial $\sigma(x)$; finding a location of zero or more symbol erasures J by evaluating the erasure locator polynomial $\Lambda(x)$ such that if $\Lambda(x)=0$ for some $x=\alpha^{-i}$ then an erasure has occurred in symbol i, and evaluating a derivative $\Lambda'(x)$ of the erasure locator polynomial $\Lambda(x)$; evaluating the errata evaluator polynomial $\omega(x)$; and determining an error magnitude for each symbol error by solving the equation:

$$E_i = \frac{\omega(x)}{\sigma'(x) \cdot \Lambda(x)} \quad \text{for } x = \alpha^{-i};$$

and determining an erasure magnitude for each symbol erasure by solving the equation:

$$J_i = \frac{\omega(x)}{\sigma(x) \cdot \Lambda'(x)} \quad \text{for } x = \alpha^{-i}.$$

Preferably, the method comprises transforming the error locator polynomial σ(x), the erasure locator polynomial Λ(x), and the errata evaluator polynomial ω(x) such that each coefficient i is transformed by a factor of $\alpha^{(2^W-B)i}$, where $GF(2^W)$ is the Galois field of the Reed Solomon code used to generate the received codeword and B is a number of symbols in the received codeword. This transformation reduces latency and improves throughput when handling shortened codewords having a length $B<2^W-1$.

According to a second aspect of the present invention there is provided a method for use in decoding Reed-Solomon encoded data, the method comprising the steps of: receiving a codeword comprising a set of symbols, and calculating a syndrome polynomial S(x) from the received codeword; receiving erasure information identifying zero or more of the symbols as J erasures, and calculating a set of terms $\alpha^{-v_i}$ where the set of $\alpha^{-v_i}$ represents locations of the J erasures; and calculating each of a modified syndrome polynomial T(x) and an erasure locator polynomial Λ(x) using the equation:

polyout(x)=polyin(x)·(x+α^{-v0})(x+α^{-v1})(x+α^{-v2}) . . . (x+α^{-vj-1})

by applying polyin(x) an initial value of S(x) to calculate T(x), and applying polyin(x) an initial value of 1 to calculate Λ(x).

According to a third aspect of the present invention there is provided a Reed-Solomon decoder, comprising: a syndrome block arranged to calculate a syndrome polynomial S(x) from a received codeword; an erasurelist block for receiving erasure information which identifies zero or more symbols in the received codeword as symbol erasures; a polynomial expander arranged to calculate a modified syndrome polynomial T(x) from the syndrome polynomial S(X) and arranged to calculate an erasure locator polynomial Λ(x), each with reference to the erasure information; a key equation block arranged to find an error locator polynomial σ(x) and an errata evaluator polynomial ω(x), from the modified syndrome polynomial T(x); a polynomial evaluator block and a Forney block arranged to determine a location and magnitude of symbol errors and symbol erasures in the received codeword, from to the error locator polynomial σ(x), the erasure locator polynomial Λ(x), and the errata evaluator polynomial ω(x); and a correction block arranged to correct the received codeword from the determined location and magnitude of each symbol error and each symbol erasure.

Preferably, the polynomial expander is time multiplexed between a first mode for generating T(x), and a second mode for generating Λ(x).

Preferably, the polynomial expander operates in the second mode to calculate the erasure locator polynomial Λ(x) in parallel with the key equation block finding an error locator polynomial σ(x) and an errata evaluator polynomial ω(x).

Preferably, the decoder comprises a first polynomial evaluator arranged to find a location of zero or more symbol errors E by evaluating the error locator polynomial σ(x) such that if σ(x)=0 for some x=α^{-i} then an error has occurred in symbol i; a second polynomial evaluator arranged to find a location of zero or more symbol erasures J by evaluating the erasure locator polynomial Λ(x) such that if Λ(x)=0 for some x=α^{-i} then an erasure has occurred in symbol i; the first and second polynomial evaluators being arranged to evaluate a derivative σ'(x) of the error locator polynomial σ(x), and a derivative Λ'(x) of the erasure locator polynomial Λ(x), respectively; a third polynomial evaluator arranged to evaluate the errata evaluator polynomial ω(x); and a Forney block arranged to determine an error magnitude for each symbol error E by solving the equation $$E_i = \frac{\omega(x)}{\sigma'(x) \cdot \Lambda(x)} \quad \text{for } x = \alpha^{-i},$$

and determining an erasure magnitude for each symbol erasure J by solving the equation $$J_i = \frac{\omega(x)}{\sigma(x) \cdot \Lambda'(x)} \quad \text{for } x = \alpha^{-i}.$$

Preferably, the decoder comprises a transform block arranged to transform each of the error locator polynomial σ(x), the erasure locator polynomial Λ(x), and the errata evaluator polynomial ω(x) such that each coefficient i is transformed by a factor of $\alpha^{(2^W-B)i}$, where $GF(2^W)$ is the Galois field of the Reed Solomon code used to generate the received codeword and B is a number of symbols in the received codeword.

According to a fourth aspect of the present invention there is provided a Reed-Solomon decoder comprising: a syndrome calculation block arranged to receive a codeword comprising a set of symbols, and calculate a syndrome polynomial S(x) from the received codeword; an erasure list block arranged to receive erasure information identifying zero or more of the symbols J as erasures, and calculate a set of terms $\alpha^{-v_i}$ where the set of $\alpha^{-v_i}$ represents locations of the J erasures; and a polynomial expander block arranged to calculate each of a modified syndrome polynomial T(x) and an erasure locator polynomial Λ(x) using the equation:

polyout(x)=polyin(x)·(x+α^{-v0})(x+α^{-v1})(x+α^{-v2}) . . . (x+α^{-vj-1})

by applying polyin(x) an initial value of S(x) to calculate T(x), and applying polyin(x) an initial value of 1 to calculate Λ(x).

For a better understanding of the invention, and to show how embodiments of the same may be carried into effect, reference will now be made, by way of example, to the accompanying diagrammatic drawings in which.

Reed-Solomon (RS) codes are a special subclass of generalised BCH codes. A Reed-Solomon code of the form RS (B,B−2T,T) defined in a Galois field $GF(2^W)$ forms codewords of length $B \leq 2^w-1$, where w is a positive integer. In each codeword of length B symbols, B−2T of these symbols are information symbols, and the remaining 2T symbols are check symbols.

The generator polynomial g(x) of an RS code can be expressed in the form:

$$g(x) = (x + \alpha^L)(x + \alpha^{L+1})(x + \alpha^{L+2}) \ldots (x + \alpha^{L+2T-1})$$
$$= g_0 + g_1 x + g_2 x^2 + \ldots + g_{2T-1} x^{2T-1} + x^{2T}$$

where $\alpha$ is a primitive element in GF $(2^w)$ and L is an integer constant. Different generating polynomials are formed with different values for L. By carefully choosing the constant L, the circuit complexity of the encoder and decoder can be reduced. In most practical cases it is convenient to let L=1.

When original data is encoded using an RS encoder employing the generator polynomial g(x), an original codeword c(x) is produced which can be represented by the polynomial:

$$c(x) = c_{B-1} x^{B-1} + c_{B-2} x^{B-2} + \ldots + c_2 x^2 + c_1 x + c_0$$

Let an error pattern e(x), caused for example during data storage or data transmission, be represented by the polynomial:

$$e(x) = e_{B-1} x^{B-1} + e_{B-2} x^{B-2} + \ldots + e_2 x^2 + e_1 x + e_0$$

Let a received codeword d(x) be represented by the polynomial:

$$d(x) = d_{B-1} x^{B-1} + d_{B-2} x^{B-2} + \cdots + d_2 x^2 + d_1 x + d_0$$
$$= c(x) + e(x)$$

The received codeword d(x) may be perfect, or may be corrupted. Hence, it is desired to check and, if necessary, correct the received codeword, using an RS decoder.

Figure 1:
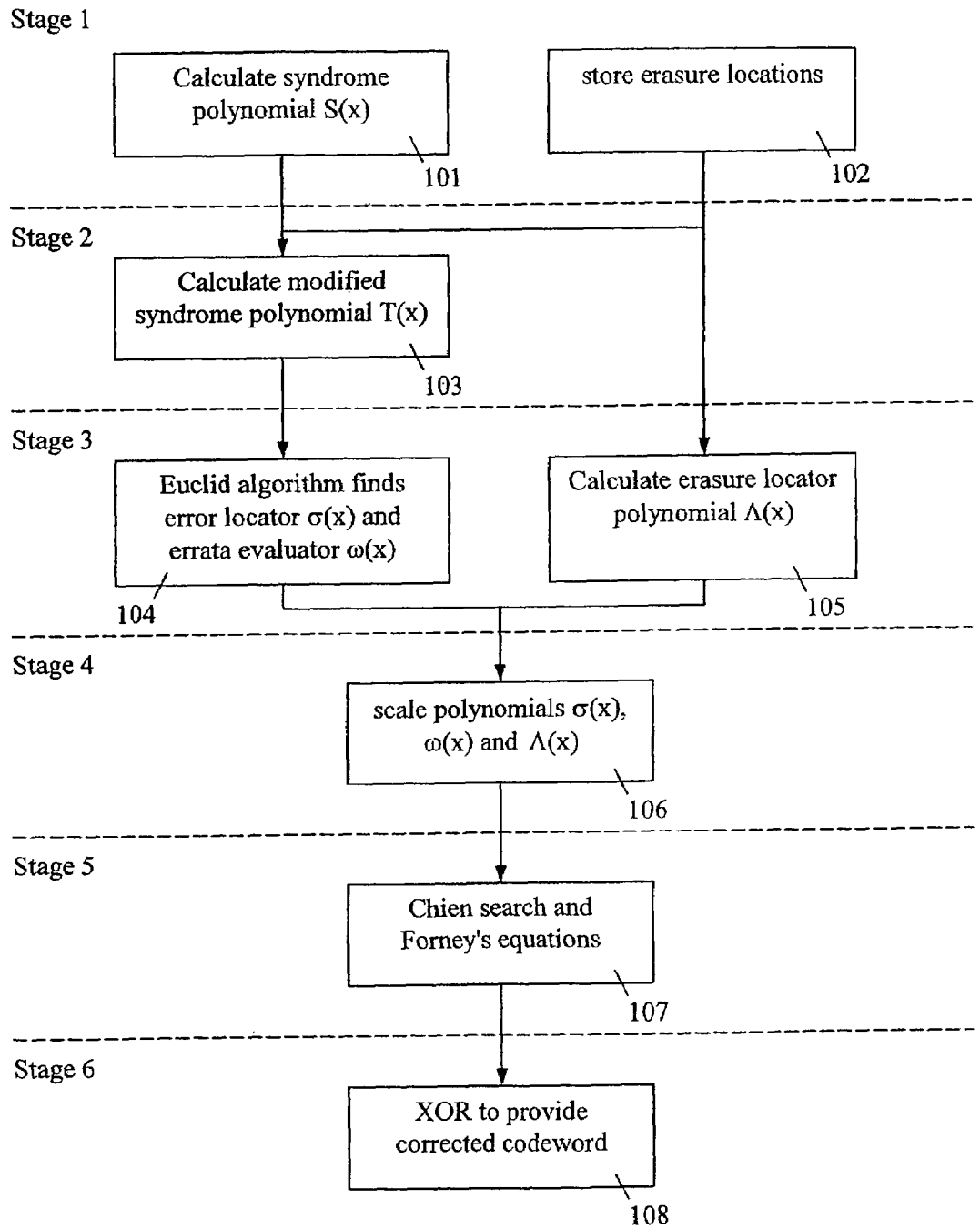
FIG. 1 shows an overview of a preferred method for decoding RS encoded data.

FIG. 1 is an overview of a preferred method for decoding of Reed-Solomon encoded data according to embodiments of the present invention.

In FIG. 1, step 101 comprises calculating a syndrome polynomial S(x):

$$S(x) = S_{2T-1} x^{2T-1} + S_{2T-2} x^{2T-2} + \ldots + S_2 x^2 + S_1 x + S_0$$

where $$S_i = d(\alpha^{L+i})$$

In step 102, erasure information is received and stored, which identifies symbols in a codeword that have been declared as an erasure.

Conveniently, steps 101 and 102 are performed substantially simultaneously in a first stage of a pipelined decoder.

In a second stage, a modified syndrome polynomial T(x) is calculated at step 103. The modified syndrome polynomial T(x) can be represented as:

$$T(x) = S(x) \cdot \Lambda(x) \bmod x^{2T}$$
$$= S(x) \cdot \prod_{i=0}^{J-1} (x + \alpha^{-v_i}) \bmod x^{2T}$$

where $v_i$ are the symbol positions of J erasures.

In a third stage, at step 104, an extended Euclidean Algorithm (or equivalent) is used to find an error locator polynomial $\Lambda(x)$ and an errata evaluator polynomial $\omega(x)$ that solve the key equation:

$$\sigma(x) \cdot T(x) \equiv \omega(x) \bmod x^{2T}$$

Also in the third stage, an erasure locator polynomial $\Lambda(x)$ is formed at step 105. The erasure locator polynomial $\Lambda(x)$ can be represented as:

$$\Lambda(x) = \prod_{i=0}^{J-1} (x + \alpha^{-v_i})$$

where $v_i$ are the symbol positions of J erasures.

In an optional fourth stage at step 106, the polynomials $\sigma(x)$, $\omega(X)$ and $\Lambda(x)$ are transformed. Transforming these three polynomials avoids a delay inherent when a shortened code is used, i.e. where the codeword contains $B<2^W-1$ symbols.

In a fifth stage, at step 107, the location and magnitude of the errors and erasures are determined. A Chien search is performed to determine the location of the errors and erasures as the roots of $\sigma(x)$ and $\Lambda(x)$ for $x \in \{\alpha^{-(B-1)} \ldots \alpha^{-(0)}\}$. The magnitude of each error or erasure is then found from Forney's equations.

In a sixth stage, at step 108, the corrected codeword is formed by applying corrections of the calculated locations and magnitudes, to the received codeword. From this corrected codeword, the information symbols of the original data are correctly obtained.

Here, it has been found that the modified syndrome polynomial T(x) and the erasure locator polynomial $\Lambda(x)$ can be calculated separately, in different stages. The key equation is then solved without reference to the erasure locator polynomial $\Lambda(x)$, resulting in the error locator polynomial $\sigma(x)$ and an errata evaluator polynomial $\omega(x)$. Instead, a three-input form of the Forney equations allows erasures to be handled later in the method. Advantageously, the decoding method is relatively fast and simple. This method allows significant improvements in the architecture of a practical Reed-Solomon decoder, as will now be described in more detail.

A Reed-Solomon decoder can be implemented in software, or in hardware, or as a combination of software and hardware. The RS decoder described herein is particularly suitable for implementation in hardware using VLSI techniques to form an ASIC (Application Specific Integrated Circuit).

Figure 2:
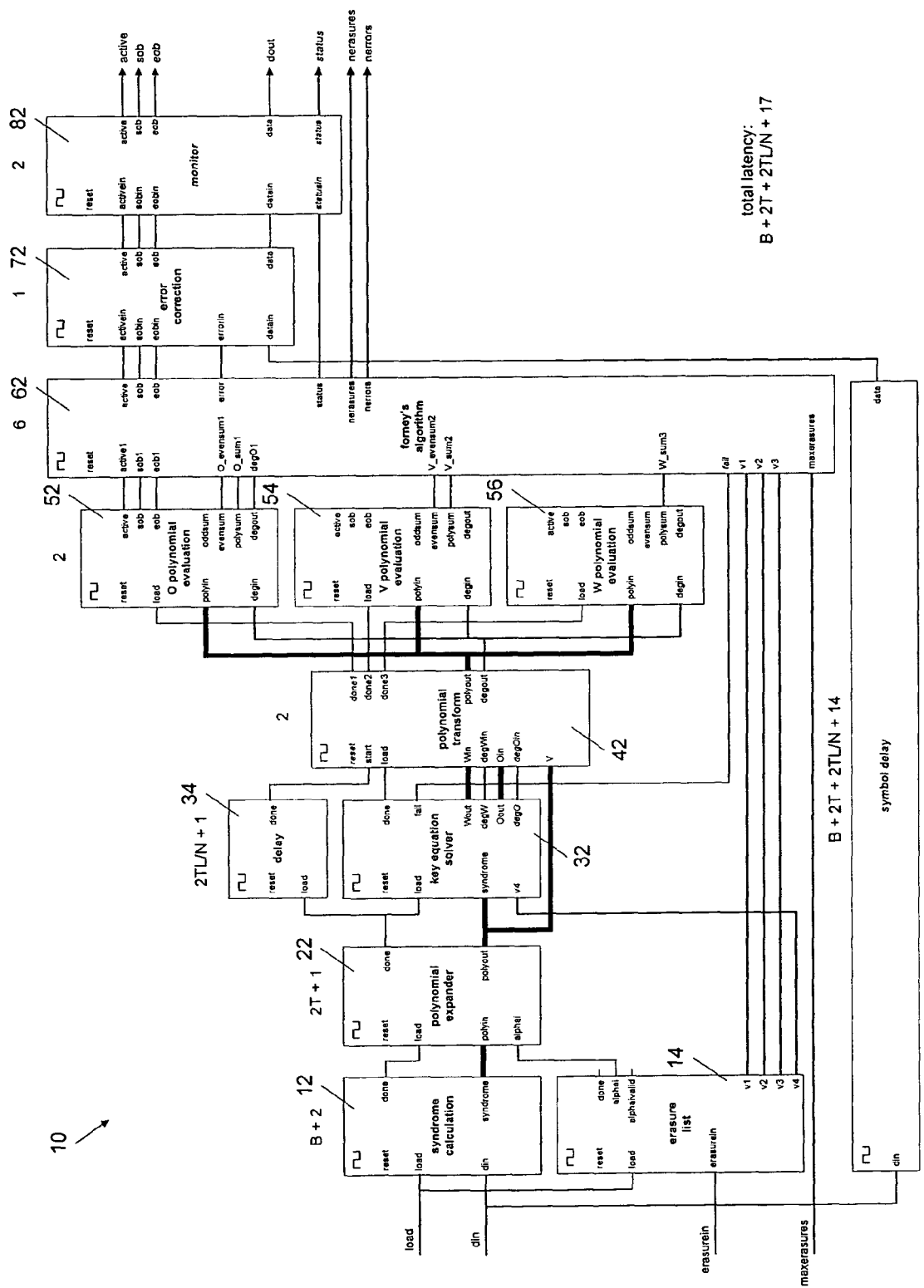
FIG. 2 is a schematic block diagram of a preferred Reed-Solomon decoder.

FIG. 2 is a schematic block diagram of a preferred RS decoder 10. Briefly, the decoder 10 comprises a syndrome calculation block 12, an erasurelist block 14, a polynomial expander 22, a key equation block 32, a delay block 34, a polynomial transform block 42, first, second and third polynomial evaluation blocks 52, 54 and 56, a Forney block 62, an error correction block 72, and a monitor block 82.

The syndrome calculation block 12 is arranged to receive a codeword containing B symbols. The symbols of the codeword form the coefficients of a polynomial, where the first symbol received is $d_{B-1}$ and the last symbol received is $d_0$. The received codeword can be represented as:

$$d(x) = d_0 + d_1 x + d_2 x^2 + d_3 x^3 + \ldots + d_{B-1} x^{B-1}$$

The syndromes are obtained by evaluating this polynomial at the roots of the generator polynomial. The generator polynomial has 2T distinct roots $(\alpha, \alpha^2, \alpha^3, \ldots, \alpha^{2T})$, and therefore there are 2T syndromes to be calculated. This assumes that L, where $\alpha^L$ is the starting root of the generator polynomial g(x), is given by L=1, but other values of L are also applicable.

The calculation of each syndrome is performed recursively, using Horner's rule:

$$\begin{aligned} syndrome_i &= d(\alpha^i) \\ &= d_0 + d_1\alpha^i + d_2\alpha^{2i} + \cdots + d_{B-1}\alpha^{(B-1)i} \\ &= d_0 + \alpha^i(d_1 + \alpha^i(d_2 + \cdots \alpha^i(d_{B-1})\cdots)) \end{aligned}$$

The order of evaluation of this recursive calculation requires the coefficients to be available in the order $d_{B-1}$ first, through to $d_0$ last. Conveniently, this matches the commonly used convention for transmission order of symbols into the decoder, where the first symbol in the codeword is used as the coefficient for the $x^{B-1}$ term, and the last symbol in the codeword is used as the coefficient for the $x^0$ term.

The erasurelist block 14 receives erasure information identifying zero or more symbols in the codeword which have been declared as erasures. Any suitable mechanism can be used to declare erasures, according to the environment in which the RS decoder 10 is employed.

The erasurelist block 14 is formed as a FIFO structure to maintain a list of up to 2T erasure locations. If the first symbol of the codeword is an erasure, then a value of $\alpha^{-(B-1)}$ is queued in the FIFO. If the next symbol is an erasure, then $\alpha^{-(B-2)}$ queued in the FIFO, and so on.

In addition to storing the erasure locations, the erasurelist block 14 pre-computes four control values, which will be used by later parts of the decoder. Let the total number of erasures in a codeword be J, then:

$v1=J$ $v2=\alpha^J$ $v3=\alpha^{-(B-1)J}$ $v4=(2T-J)L/N$ if $J\leq 2T$, else=0

The v1, v2 and v3 control values are supplied to the Forney block 62, and the v4 control value is supplied to the key equation block 32. L/N represents a degree of parallelism in the architecture of the decoder, in particular in the key equation block 32, but for the purposes of this document L/N can be treated as a positive integer constant.

In the architecture of the preferred RS decoder shown in FIG. 2, only a single polynomial expander 22 is provided. The purpose of this block is to calculate both (a) the erasure locator polynomial $\Lambda(x)$, and (b) the modified syndrome polynomial $T(x)$.

The erasure locator polynomial $\Lambda(x)$ can be represented by:

$\Lambda(x)=(x+\alpha^{-v_0})(x+\alpha^{-v_1})(x+\alpha^{-v_2})\ldots(x+\alpha^{-v_{j-1}})$ where the set of $\alpha^{-v_i}$ represents locations of J erasures where $0\leq J\leq 2T$.

The modified syndrome polynomial $T(x)$ can be represented as:

$T(x)=S(x)\cdot\Lambda(x)$ where $S(x)$ is the syndrome polynomial.

In both cases, the same basic operation is used:

polyout$(x)$=polyin$(x)\cdot(x+\alpha^{-v_0})(x+\alpha^{-v_1})(x+\alpha^{-v_2})\ldots(x+\alpha^{-v_{j-1}})$ To calculate $T(x)$, polyin$(x)$ is set to $S(x)$.
To calculate $\Lambda(x)$, polyin$(x)$ is set to 1.

Conveniently, the same hardware is used to generate both $T(x)$ and $\Lambda(x)$, by time multiplexing these two functions of the polynomial expander 22. That is, in a first mode the polynomial expander 22 generates $T(x)$ and passes the result to the key equation block 32. Then, in a second mode, the polynomial expander 22 generates $\Lambda(x)$ and passes the result to the polynomial scaler 42.

Advantageously, it has been found that using a single polynomial expander 22 assists by significantly simplifying the RS decoder. Further, there is no significant time penalty to the latency of the decoder, since the polynomial expander 22 can operate in the second mode to generate $\Lambda(x)$, while the key equation block 32 operates on the previously output $T(x)$. The latency of the polynomial expander 22 is at most 2T+1 clock cycles.

In the first mode, a polynomial register is initialised with $S(x)$, and over the next 2T clock cycles the erasure locations $\alpha^{v_i}$ are consumed. At the end of 2T cycles, the polynomial register holds $T(x)$. A "done" control signal is asserted at this point to indicate the cycle in which $T(x)$ is available.

In the second mode, the polynomial register is initialised with 1 and over the next 2T clock cycles the erasure locations $\alpha^{v_i}$ are consumed. At the end of 2T cycles, the polynomial register holds $\Lambda(x)$. This value is held until a "load" control signal is asserted, to signify the arrival of a next codeword.

The erasure locations are stored in a shift register for re-use from the first mode to the second mode, so that they only need to be input to the polynomial expander block once. A value of zero is an invalid erasure location, and so this is used as padding when J<2T.

The construction of the preferred polynomial expander 22 will now be described in more detail, with reference to FIG. 3.

The basic purpose of the polynomial expander is to multiply together two polynomials a(x) and b(x), yielding a third polynomial, p(x):

$p(x)=a(x)\cdot b(x) \bmod x^{2T}$

The first of these polynomials, a(x), is required to be in polynomial form:

$a(x)=a_0+a_1x+a_2x^2+\ldots+a_{2T-1}x^{2T-1}$

The second of these polynomials, b(x), is required to have been factored:

$b(x)=(x+b_0)(x+b_1)(x+b_2)\ldots(x+b_{2T-1})$

Thus:

$$\begin{aligned} p(x) &= a(x)\cdot b(x) \bmod x^{2T} \\ &= (a_0 + a_1x + a_2x^2 + \cdots + a_{2T-1}x^{2T-1})(x+b_0) \\ &\quad (x+b_1)(x+b_2)\cdots(x+b_{2T-1}) \end{aligned}$$

This can be broken down into a series of simpler operations, each handling one factor of b(x):

$p_0(x)=a(x)$ $p_1(x)=p_0(x)(x+b_0)$ $p_2(x)=p_1(x)(x+b_1)$ $p_3(x)=p_2(x)(x+b_2)$ $\ldots$ $p_{2T}(x)=p_{2T-1}(x)(x+b_{2T-1})$ The basic operation is p'(x)=p(x)(x+v) where v takes the value $b_0, b_1, b_2, \ldots$ over successive iterations. The hardware directly implements this basic operation in a single cycle.

Now, we expand this operation, so that the individual coefficients of p'(x) are visible:

$$\begin{aligned}
p'(x) &= p(x)(x+v) \\
&= xp(x) + vp(x) \\
&= x(p_0 + p_1 x + p_2 x^2 + \cdots p_{2T-1} x^{2T-1}) + \\
&\quad v(p_0 + p_1 x + p_2 x^2 + \cdots p_{2T-1} x^{2T-1}) \\
&= (p_0 v) + (p_1 v + p_0)x + (p_2 v + p_1)x^2 + \cdots + \\
&\quad (p_{2T-1} v + p_{2T-2})x^{2T-1} \\
&= p'_0 + p'_1 + p'_2 x^2 + \cdots + p_{2T-1} x^{2T-1}
\end{aligned}$$

Examining the individual coefficients of p'(x):

$p'_0 = p_0 v$ $p'_1 = p_1 v + p_0$ $p'_2 = p_2 v + p_1$

...

$p'_{2T-1} = p_{2T-1} v + p_{2T-2}$

It can be seen that the i'th coefficient of p'(x) is formed by taking the i'th coefficient of p(x), multiplying it by the constant v, and adding in the i−1'th coefficient of p(x):

$p'_i = p_i v + p_{i-1}$

Figure 3:
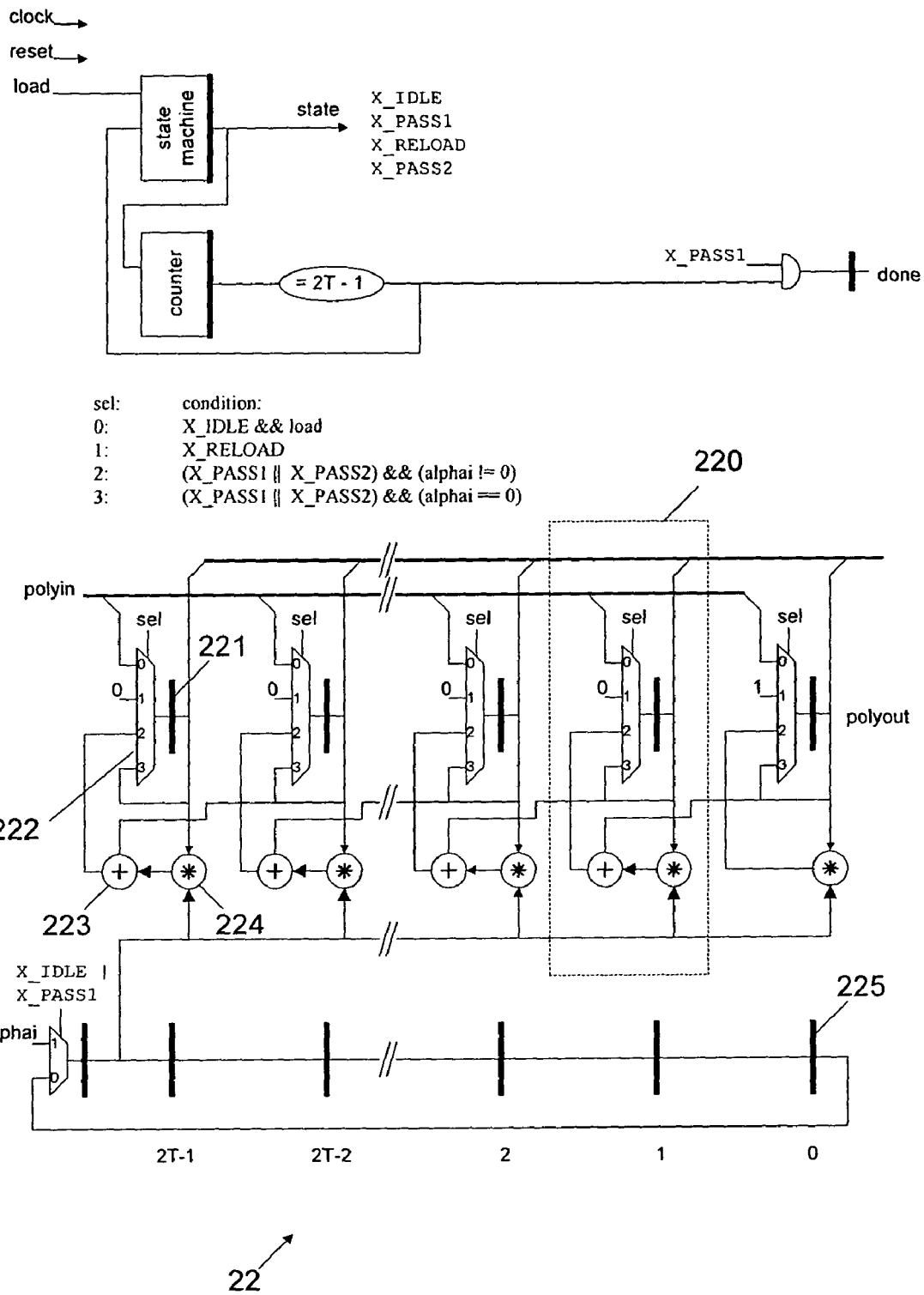
FIG. 3 is a schematic block diagram of a polynomial expander.

Referring to the schematic block diagram of FIG. 3, a basic building block 220 comprising a register 221, multiplexor 222, adder 223 and multiplier 224 is repeated for each coefficient in the polynomial.

The multiplexor 222 has four inputs:

0. Load coefficient register $p'_i$ with an external value. This is used to initialise the polynomial register when calculating T(X) from S(X).
1. Load coefficient register $p'_i$ with a constant. This is used to initialise the polynomial register when calculating Λ(x).
2. Load the coefficient register $p'_i p_i v + p_{i-1}$. This is part of the normal recursive calculation described above. Note the $p_i$ value comes from the coefficient register of this stage, and $p_{i-1}$ value comes from the coefficient register of the next stage.
3. Load the coefficient register $p'_i = p_i$. This is employed if b(x) comprises fewer than 2T factors.

The same v value is used in each stage, and this is generated externally to the polynomial expander 22. As was described earlier, the polynomial expander is used twice: first to calculate T(X) (pass one) and subsequently to calculate Λ(x) (pass two). The set of v values used in pass one is stored in a shift register 225 of length 2T for reuse in pass two. Thus, the external circuitry only has to source these values once.

Referring again to FIG. 2, the description of the general architecture of the preferred RS decoder will now continue.

The key equation block 32 receives the modified syndrome polynomial T(X) from the polynomial expander 22, and from T(x) calculates values of the error locator polynomial σ(x) and the errata evaluator polynomial ω(x) that solve the key equation:

$\sigma(x) \cdot T(x) \equiv \omega(x) \bmod x^{2T}$

The key equation block 32 preferably applies Euclid's algorithm to solve the key equation. In alternate embodiments of the invention, the key equation block 32 is replaced by a functional equivalent. For example, alternate approaches to solving the key equation and finding σ(x) and ω(x) include Berlekamp, Berlekamp-Massey, and continued fractions.

A detailed discussion as background to the preferred implementation of Euclid's algorithm is provided in the paper "A Hypersystolic Reed-Solomon Decoder" by E. Berlekamp, G. Seroussi and P. Tong published at pages 205–241 of "Reed-Solomon Codes and their Applications", Edited by S. B. Wicker and V. K. Bhargava, IEEE Press, New York, 1994, ISBN 0-7803-1025-X.

In most prior art relating to RS decoders for errors and erasures, such as that referenced above, the Euclid algorithm is used to generate an errata locator polynomial, and an errata evaluator polynomial, leading to a key equation block for errors and erasures which is larger than that required solely for errors. However, in the present invention, the key equation block 32 is used to generate the error locator polynomial σ(x) and the errata evaluator polynomial ω(x). As a result, the key equation block 32 is more compact. In the preferred embodiment, the key equation block 32 is no larger than in a RS decoder handling only errors.

Figure 4:
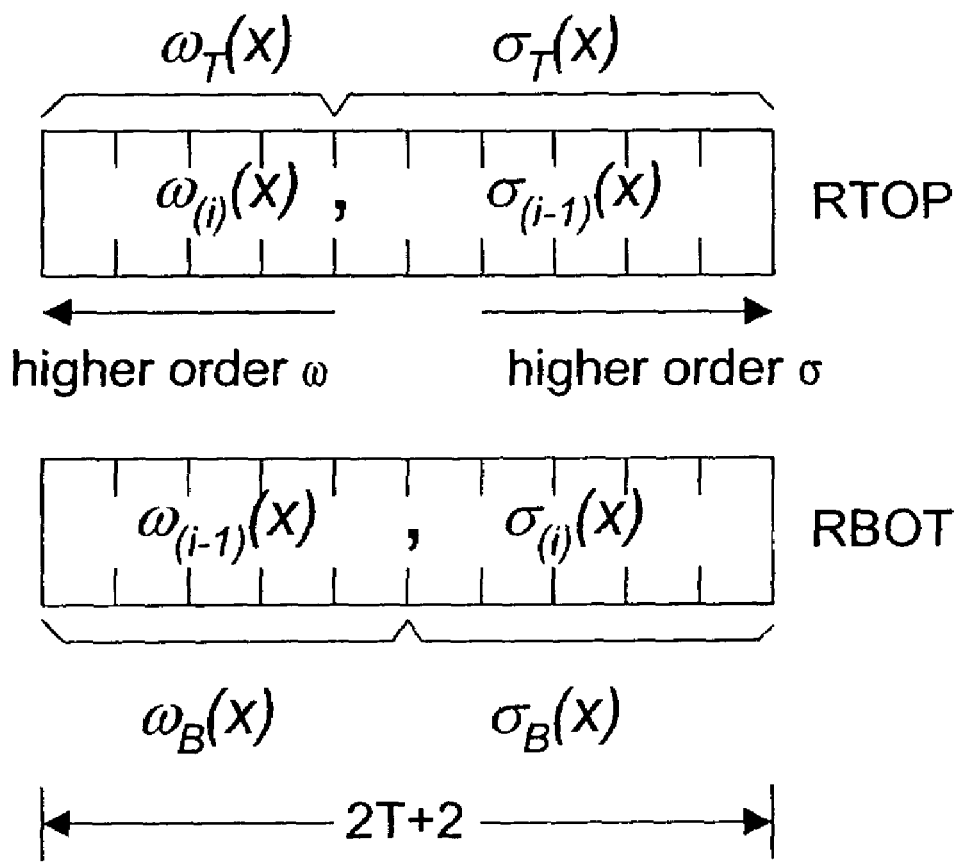
FIG. 4 shows a data structure employed in a key equation block.

In the preferred key equation block 32, a data structure is defined as shown in FIG. 4. This data structure efficiently holds four polynomials. The maximum degree of each polynomial is 2T (so each polynomial takes up 2T+1 register slots). However, the algorithm is such that as the degree of $\sigma_i(x)$ increases, so the degree of $\omega_i(x)$ decreases. Thus it is possible to pack both polynomials into 2T+2 register slots.

The following procedure describes the computation performed:

1. Initialize $\omega_T(x) := x^{2T} \sigma_T(x) := 1$ $\omega_B(x) := T(x) \sigma_B(x) := 0$ At all times maintain δ=deg $\omega_T(x)$−deg $\omega_B(x)$.
    Initially δ=1

2. Repeat 2T−J times (where J is the number of erasures):
    a. set
        $\mu_T$:=left most (leading) coefficient of $\omega_T(x)$
        $\mu_B$:=left most (leading) coefficient of $\omega_B(x)$
    b. if $\mu_B \neq 0$ and δ>0 (i.e. the bottom comma is to the left of the top comma), then
        swap RTOP and RBOT
        swap $\mu_T$ and $\mu_B$
    c. if $\mu_B \neq 0$, then set $\omega_B(x) := \mu_T \omega_B(x) - x^\delta \mu_B \omega_T(x)$ $\sigma_T(x) := \mu_T \sigma_T(x) - x^\delta \mu_B \sigma_B(x)$ d. shift RBOT (and its comma) one position to the left.

3. Output $\omega_B(X)$ as ω(x) and $\sigma_T(x)$ as σ(x).

This differs from a generally-known prior-art procedure in two main aspects:
i. the procedure is initialised with T(x) rather than S(x) (in order to process for both errors and erasures); and
ii. the number of iterations is reduced from 2T to 2T−J (thereby allowing faster decoding).

The latency through the key equation block varies depending on the number of erasures J. The delay block 34 is provided to ensure that the decoder as a whole has constant latency. The delay block 34 indicates that a valid output of the key equation block 32 is available a constant number of cycles after the Euclidean computation starts, rather than on its completion.

Referring again to FIG. 2, three polynomial evaluators 52, 54, and 56 are provided to evaluate $\sigma(x)$, $\Lambda(x)$ and $\omega(x)$, respectively.

The first polynomial evaluator 52 is used to determine the roots of the error locator polynomial $\sigma(x)$, which indicate the locations of symbol errors. An exhaustive search is used to determine these roots, suitably a Chien search or equivalent. Similarly, the second polynomial evaluator 54 performs an equivalent function for the erasure locator polynomial $\Lambda(x)$. The third polynomial evaluator 56 evaluates the errata evaluator polynomial $\omega(x)$.

The Chien search involves evaluating $\sigma(x)$ for $X \in \{\alpha^{-(B-1)} \ldots \alpha^{-(0)}\}$.

For a full length code $B=2^W-1$ and the first location checked is:

$$x = \alpha^{-(B-1)} = \alpha^{-((2^W-1)-1)} = \alpha^{(2^W-1)}\alpha^{-((2^W-1)-1)} = \alpha$$

The next location would be:

$$x = \alpha^{-(B-2)} = \alpha^{-((2^W-1)-2)} = \alpha^{(2^W-1)}\alpha^{-((2^W-1)-2)} = \alpha^2$$

and so on. The classic approach to implementing the Chien search uses the following:

$$\sigma(x) = \sigma_0 + \sigma_1 x + \sigma_2 x^2 + \ldots + \sigma_{2T} x^{2T}$$

$$\sigma(\alpha) = \sigma_0 + \sigma_1 \alpha + \sigma_2 \alpha^2 + \ldots + \sigma_{2T} \alpha^{2T}$$

$$\sigma(\alpha^2) = \sigma_0 + \sigma_1 \alpha^2 + \sigma_2 \alpha^4 + \ldots + \sigma_{2T} \alpha^{4T}$$

$$\sigma(\alpha^3) = \sigma_0 + \sigma_1 \alpha^3 + \sigma_2 \alpha^6 + \ldots + \sigma_{2T} \alpha^{6T}$$

etc

Figure 5:
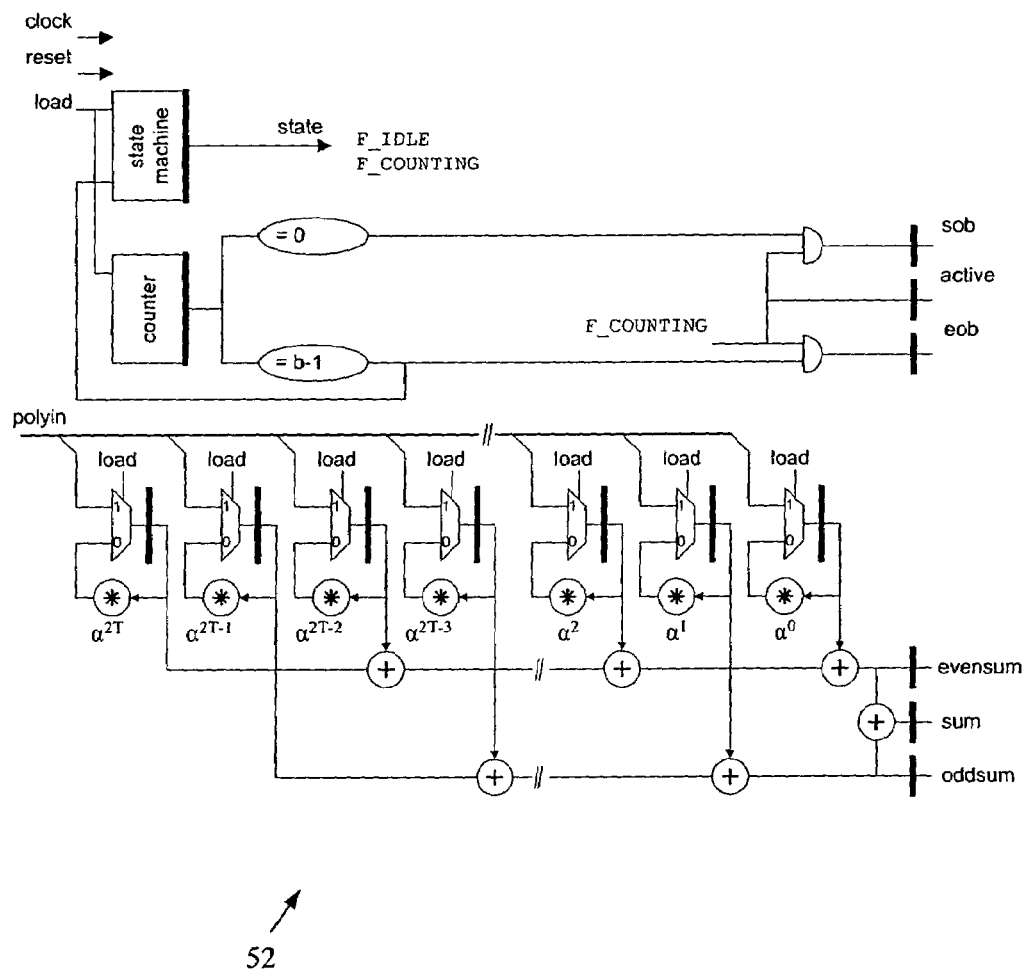
FIG. 5 shows a basic cell used in a polynomial evaluator block.

FIG. 5 is a schematic block diagram of the first polynomial expander 52. The second and third polynomial expanders have a similar construction. The computation described above is implemented by 2T+1 stages, where each stage includes a register, a constant multiplier and an adder, connected as shown in FIG. 5.

The registers are initialised with the coefficients of $\sigma(x)$. Over successive clock cycles, the $i^{th}$ coefficient is repeatedly multiplied by $\alpha^i$, and the results summed.

One clock cycle after loading, the sum will be $\sigma(\alpha)$; this will be zero if there is an error in the first symbol of the codeword. In general, after N clocks, the sum will be $\sigma(\alpha^N)$; this will be zero if there is an error in the $N^{th}$ symbol of the codeword.

So far the operation for full-length codes has been described, where the codeword has a length equal to the length of the Galois Field of the code, i.e. $B=2^w-1$. In general, it is also desired to handle shortened codes; where $B<2^w-1$.

The above hardware still works in this case, but needs $2^W-B$ clock cycles following initialisation before the first useful result $\sigma(\alpha^{-(B-1)})$ is obtained. This is effectively dead time, and limits the overall throughput of the decoder, preventing it from decoding back-to-back codewords. Even in the ideal case of a full-length code, there is one cycle of dead time because the initialisation value $\sigma(\alpha^0)$ does not correspond to a location within the codeword.

For a shortened code, the first location checked should be:

$$x = \alpha^{-(B-1)} = \alpha^{(2^W-1)}\alpha^{-(B-1)} = \alpha^{2^W-B}$$

The next location would be:

$$x = \alpha^{-(B-2)} = \alpha^{(2^W-1)}\alpha^{-(B-2)} = \alpha^{2^W-B+1}$$

and so on.

Optionally, the transform block 42 is provided to implement a polynomial transformation which allows a Chien search to be performed immediately, and avoids a delay corresponding to "empty" information symbols. There are three polynomials that require this transformation, namely the error locator polynomial $\sigma(x)$ and the errata evaluator polynomial $\omega(x)$ from the key equation block 32, and the erasure locator polynomial $\Lambda(x)$ from the polynomial expander block 22. Once a control signal "start" is asserted, these polynomials are processed over successive clock cycles. Three "done" signals indicate to subsequent blocks when each transformed polynomial (and its true degree) is available.

Figure 6:
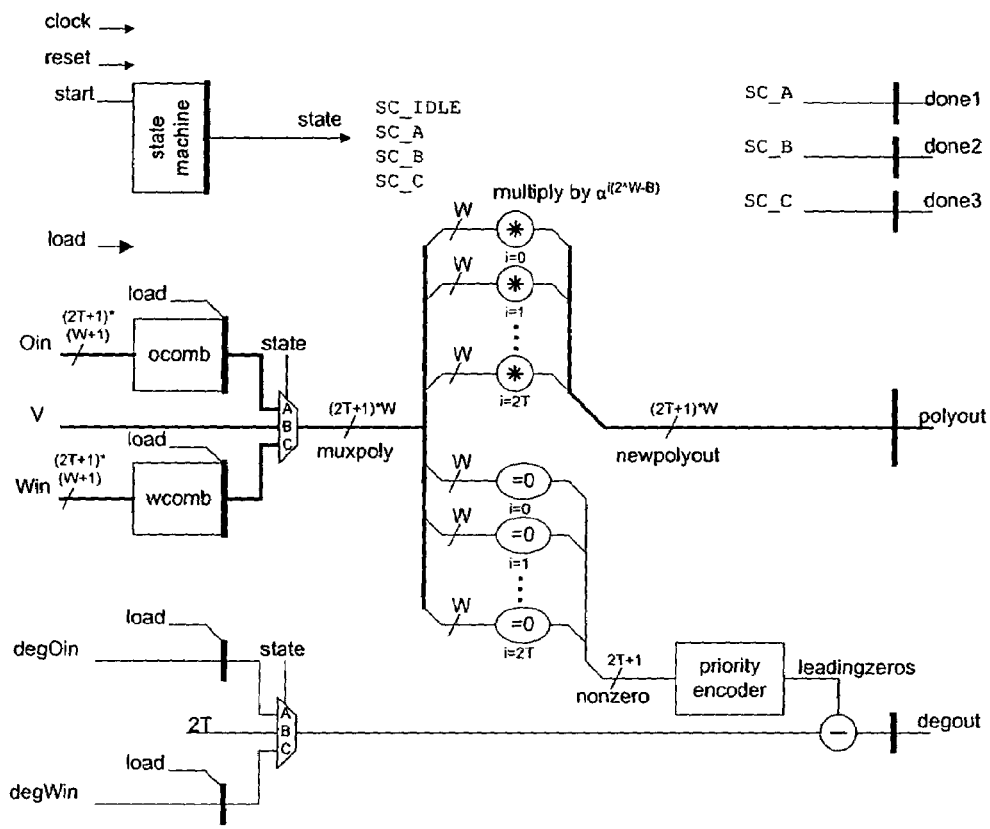
FIG. 6 is a schematic block diagram of a transform block.

FIG. 6 is a schematic block diagram of the transform block 42. To eliminate the dead time, the coefficients of $\sigma(x)$ are transformed to allow the Chien search to start immediately at position B-1. The $i^{th}$ coefficient of $\sigma(x)$ is transformed by a factor of $\alpha^{(2^W-B)i}$. As shown in FIG. 6, a bank of 2T constant multipliers achieve this in one cycle.

In this example embodiment there is some redundancy, because $\sigma(x)$ can be of degree at most T. However, the other polynomials $\omega(x)$ and $\Lambda(x)$ can be of degree 2T, and since the transform block 42 is shared, it is assumed that any of the polynomials can be of degree 2T. If desired, a separate transform block is provided for each polynomial.

The format of the polynomials $\sigma(x)$ and $\omega(x)$ produced in the key equation block 32 is non-standard, due to the layout of registers within that block. The transform block 42 advantageously maps $\sigma(x)$ and $\omega(x)$ to a standard format. In this architecture, the $\Lambda(x)$ polynomial does not require any reformatting.

Figure 7:
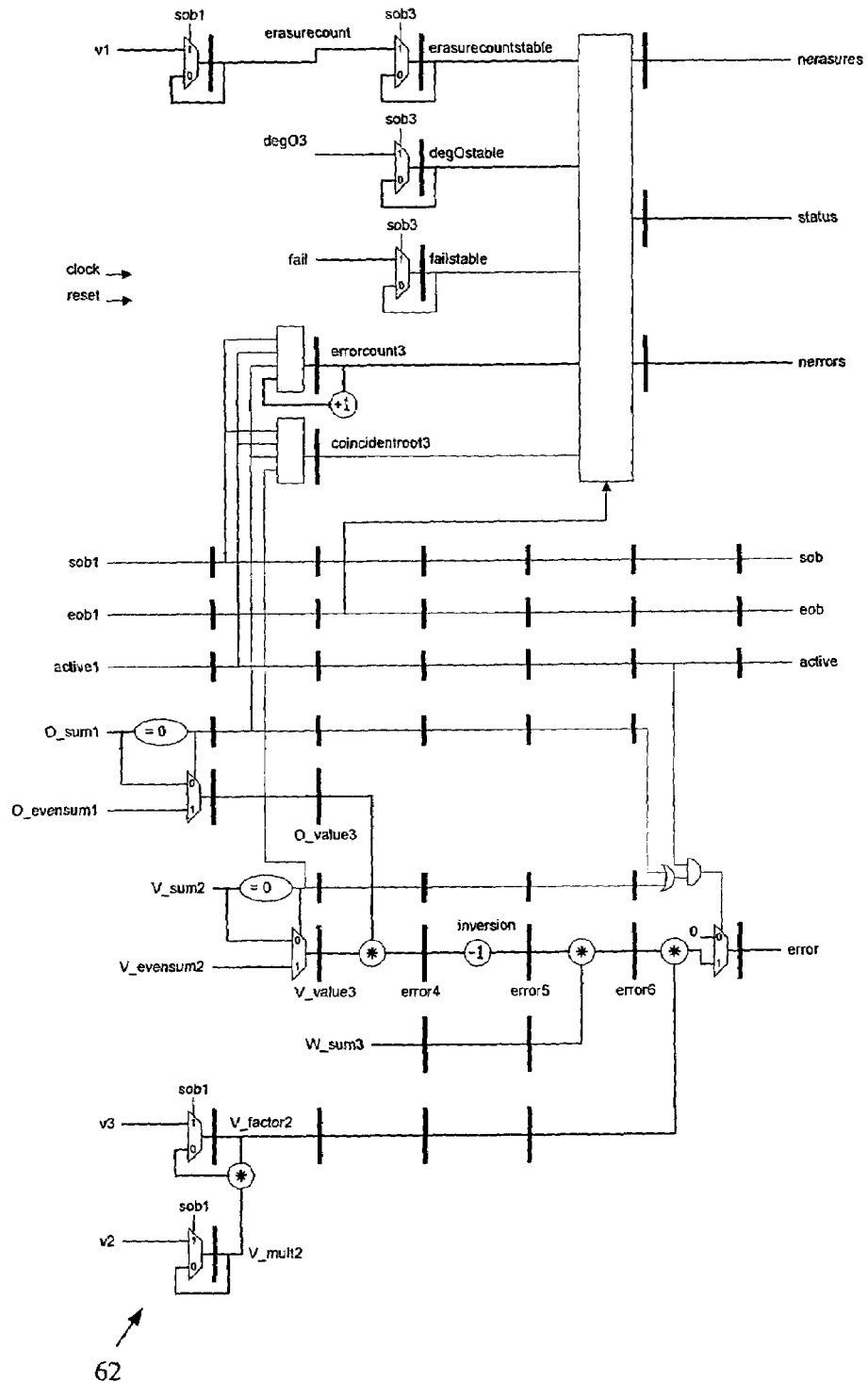
FIG. 7 is a schematic block diagram of a Forney block.

FIG. 7 shows a preferred circuit for the Forney block 62.

The Forney block 62 is implemented as a pipelined datapath, driven by the three polynomial evaluation blocks 52, 54, 56 for $\sigma(x)$, $\Lambda(x)$ and $\omega(x)$. There is one cycle skew between each of these blocks, due to the transform block 42, and thus the results feed into the datapath at different stages.

As described previously, a Chien search (or equivalent) is performed by the polynomial evaluators 52, 54, 56 evaluating $\sigma(x)$, $\omega(x)$ and $\Lambda(x)$ for $x \in \{\alpha^{-(B-1)} \ldots \alpha^{-(0)}\}$. From these values, Forney equations are used in the Forney block 62 to calculate the error magnitudes.

In the preferred embodiment, the Forney equations are applied in the form that if $\sigma(x)=0$ for some $x=\alpha^{-i}$ then an error has occurred in symbol i, and the error magnitude is given by:

$$E_i = \frac{\omega(x)}{\sigma'(x) \cdot \Lambda(x)} \text{ for } x = \alpha^{-i};$$

and if $\Lambda(x)=0$ for some $x=\alpha^{-i}$ then an erasure has occurred in symbol i, and the erasure magnitude is given by:

$$J_i = \frac{\omega(x)}{\sigma(x) \cdot \Lambda'(x)} \text{ for } x = \alpha^{-i}$$

It can be shown that if $\sigma(x)=0$ then it is possible to obtain $x\sigma'(x)$ by summing either the odd or even power terms of $\sigma(x)$, and conveniently divide by x as shown in the circuit of FIG. 7.

The Forney block 62 uses a "status" line to indicate a successful correction. However, if an uncorrectable condition of the codeword is detected, then the status line is asserted to indicate the nature of the uncorrectable error.

The symbol delay block 16 introduces a delay to the symbol data of the received codeword, to compensate for the delay through the other blocks in the decoder. It is implemented as a symbol-wide shift register.

This delay includes:

B+2 stages to compensate for the syndrome block 12;

2T+1 stages to compensate for the polynomial expander block 22;

(2TL/N)+1 stages to compensate for the Euclid and delay blocks 32, 34;

2 stages to compensate for the transform block 42;

2 stages to compensate for the polynomial evaluation blocks 52, 54, 56; and 6 stages to compensate for the Forney block 62.

Totalling these up yields B+2T+(2TL/N)+14 stages. For B=160, T=16, L=36 and N=12, the delay is 302 stages.

The error correction block 72 performs error correction by XORing the delayed symbol data of the received codeword with the correction output of the Forney block 62.

The monitor block 82 is optionally provided as a final pipeline stage within the decoder. As an additional check, the decoder re-calculates the syndromes over each sequence of symbols output by the decoder, in the monitor block 82. This allows mistakes in the decoder to be identified, and confirms that uncorrectable codewords are correctly identified.

A Reed-Solomon decoder and decoding method have been described which handle errors and erasures decoding in a manner which is efficient and which is convenient to implement. A single polynomial expander is employed. A smaller and simpler key equation block is used to apply Euclid's algorithm. The Forney equations are applied in a three-input form. These improvements, alone and in combination, aid in significantly reducing cost and complexity, and reducing physical size of a hardware implementation of the decoder. Other advantages will be apparent from the foregoing description.

The invention claimed is:

1. A method for decoding of Reed-Solomon encoded data, comprising the steps of:

receiving a codeword comprising a set of symbols, and calculating a syndrome polynomial S(x) for the received codeword;

receiving erasure information which identifies zero or more symbols in the received codeword that have been declared as a symbol erasure;

calculating a modified syndrome polynomial T(x) from the syndrome polynomial S(x) and then calculating an erasure locator polynomial Λ(x), each with reference to the received erasure information;

finding an error locator polynomial σ(x) and an errata evaluator polynomial ω(x), from the modified syndrome polynomial T(x);

determining a location and magnitude of symbol errors and symbol erasures in the received codeword, from the error locator polynomial σ(x), the erasure locator polynomial Λ(x), and the errata evaluator polynomial ω(x); and correcting the received codeword using the determined location and magnitude of symbol errors and symbol erasures.

2. The method of claim 1, comprising receiving the erasure information identifying zero or more of the symbols J as erasures, and calculating a set of terms $\alpha^{-v_i}$ where the set of $\alpha^{-v_i}$ represents locations of the J erasures; and calculating each of a modified syndrome polynomial T(x) and an erasure locator polynomial Λ(x) using the equation:

$$\text{polyout}(x) = \text{polyin}(x) \cdot (x + \alpha^{-v_0})(x + \alpha^{-v_1})(x + \alpha^{-v_2}) \ldots (x + \alpha^{-v_{j-1}})$$

by setting polyin(x) to S(x) to calculate T(x), and setting polyin(x) an initial value of 1 to calculate Λ(x).

3. The method of claim 1, comprising calculating the modified syndrome polynomial T(x) in a first time multiplexed mode, and then generating the erasure locator polynomial Λ(x) in a second time multiplexed mode.

4. The method of claim 3, comprising calculating the erasure locator polynomial Λ(x) in parallel with the step of finding the error locator polynomial σ(x) and the errata evaluator polynomial ω(x).

5. The method of claim 1, wherein the calculating step comprises calculating each of T(x) and Λ(x) using a single polynomial expander.

6. The method of claim 1, wherein finding the error locator polynomial σ(x) and the errata evaluator polynomial ω(x) from the modified syndrome polynomial T(x) comprises solving the key equation:

$$\sigma(x) \cdot T(x) \equiv \omega(x) \bmod x^{2T}.$$

7. The method of claim 6, comprising solving the key equation by Euclid's algorithm.

8. The method of claim 1, comprising:

finding a location of zero or more symbol errors E by evaluating the error locator polynomial σ(x) such that if σ(x)=0 for some $x = \alpha^{-i}$ then an error has occurred in symbol i, and evaluating a derivative σ'(x) of the error locator polynomial σ(x);

finding a location of zero or more symbol erasures J by evaluating the erasure locator polynomial Λ(x) such that if Λ(x)=0 for some $x = \alpha^{-i}$ then an erasure has occurred in symbol i, and evaluating a derivative Λ'(x) of the erasure locator polynomial Λ(x); evaluating the errata evaluator polynomial ω(x); and determining an error magnitude for each symbol error by solving the equation:

$$E_i = \frac{\omega(x)}{\sigma'(x) \cdot \Lambda(x)} \text{ for } x = \alpha^{-i};$$

and determining an erasure magnitude for each symbol erasure by solving the equation:

$$J_i = \frac{\omega(x)}{\sigma(x) \cdot \Lambda'(x)} \text{ for } x = \alpha^{-i}.$$

9. The method of claim 1, comprising:

transforming the error locator polynomial σ(x), the erasure locator polynomial Λ(x), and the errata evaluator polynomial ω(x) such that each coefficient i is transformed by a factor of $\alpha^{(2^W - B)i}$, where $GF(2^W)$ is the Galois field of the Reed Solomon code used to generate the received codeword and B is a number of symbols in the received codeword.

10. A Reed-Solomon decoder, comprising:
a syndrome block arranged to calculate a syndrome polynomial S(x) from a received codeword;
an erasurelist block for receiving erasure information which identifies zero or more symbols in the received codeword as symbol erasures;
a polynomial expander arranged to calculate a modified syndrome polynomial T(x) from the syndrome polynomial S(X) and arranged to calculate an erasure locator polynomial Λ(x), each with reference to the erasure information;
a key equation block arranged to find an error locator polynomial σ(x) and an errata evaluator polynomial ω(x), from the modified syndrome polynomial T(x);
a polynomial evaluator block and a Forney block arranged to determine a location and magnitude of symbol errors and symbol erasures in the received codeword, from to the error locator polynomial σ(x), the erasure locator polynomial Λ(x), and the errata evaluator polynomial ω(x); and
a correction block arranged to correct the received codeword from the determined location and magnitude of each symbol error and each symbol erasure.

11. The decoder of claim 10, wherein the polynomial expander is time multiplexed between a first mode for generating T(x), and a second mode for generating Λ(x).

12. The decoder of claim 11, wherein the polynomial expander operates in the second mode to calculate the erasure locator polynomial Λ(x) in parallel with the key equation block finding an error locator polynomial σ(x) and an errata evaluator polynomial ω(x).

13. The decoder of claim 10, comprising:
a first polynomial evaluator arranged to find a location of zero or more symbol errors E by evaluating the error locator polynomial σ(x) such that if σ(x)=0 for some $x=\alpha^{-i}$ then an error has occurred in symbol i;
a second polynomial evaluator arranged to find a location of zero or more symbol erasures J by evaluating the erasure locator polynomial Λ(x) such that if Λ(x)=0 for some $x=\alpha^{-i}$ then an erasure has occurred in symbol i;
the first and second polynomial evaluators being arranged to evaluate a derivative σ'(x) of the error locator polynomial σ(x), and a derivative Λ'(x) of the erasure locator polynomial Λ(x), respectively;
a third polynomial evaluator arranged to evaluate the errata evaluator polynomial ω(x); and
a Forney block arranged to determine an error magnitude for each symbol error E by solving the equation $$E_i = \frac{\omega(x)}{\sigma'(x) \cdot \Lambda(x)} \text{ for } x = \alpha^{-i},$$

and
determining an erasure magnitude for each symbol erasure J by solving the equation $$J_i = \frac{\omega(x)}{\sigma(x) \cdot \Lambda'(x)} \text{ for } x = \alpha^{-i}.$$

14. The decoder of claim 10, comprising:
a transform block arranged to transform each of the error locator polynomial σ(x), the erasure locator polynomial Λ(x), and the errata evaluator polynomial ω(x) such that each coefficient i is transformed by a factor of $\alpha^{(2W-B)i}$, where $GF(2^W)$ is the Galois field of the Reed Solomon code used to generate the received codeword and B is a number of symbols in the received codeword.

* * * * *